(12) United States Patent
Berzins et al.

(10) Patent No.: US 10,819,342 B2
(45) Date of Patent: Oct. 27, 2020

(54) LOW-POWER LOW-SETUP INTEGRATED CLOCK GATING CELL WITH COMPLEX ENABLE SELECTION

(71) Applicant: Samsung Electronics Co., Ltd., Suwon-si, Gyeonggi-do (KR)

(72) Inventors: Matthew Berzins, Cedar Park, TX (US); Lalitkumar Motagi, Austin, TX (US)

(73) Assignee: SAMSUNG ELECTRONICS CO., LTD. (KR)

(*) Notice: Subject to any disclaimer, the term of this patent is extended or adjusted under 35 U.S.C. 154(b) by 0 days.

(21) Appl. No.: 16/352,816

(22) Filed: Mar. 13, 2019

(65) Prior Publication Data

US 2020/0204180 A1    Jun. 25, 2020

Related U.S. Application Data

(60) Provisional application No. 62/783,171, filed on Dec. 20, 2018.

(51) Int. Cl.
*H03K 19/00*    (2006.01)

(52) U.S. Cl.
CPC ..... *H03K 19/0016* (2013.01); *H03K 19/0013* (2013.01)

(58) Field of Classification Search
CPC .............. H03K 19/0016; H03K 19/0013
USPC ........................................................ 326/41
See application file for complete search history.

(56) References Cited

U.S. PATENT DOCUMENTS

| | | | |
|---|---|---|---|
| 7,639,057 B1* | 12/2009 | Su | G06F 1/10 326/93 |
| 8,030,982 B2 | 10/2011 | Datta et al. | |
| 8,604,831 B2 | 12/2013 | Myers et al. | |
| 8,643,411 B1 | 2/2014 | Goyal et al. | |
| 9,564,897 B1* | 2/2017 | Berzins | H03K 19/0016 |
| 9,577,635 B2* | 2/2017 | Rasouli | H03K 19/0016 |
| 9,887,698 B2 | 2/2018 | Liu et al. | |
| 2003/0025529 A1* | 2/2003 | Bailey | H03K 19/0963 326/93 |
| 2010/0109707 A1 | 5/2010 | Srivastava et al. | |
| 2014/0018271 A1 | 1/2014 | Onumata et al. | |
| 2016/0315616 A1 | 10/2016 | Kim et al. | |
| 2018/0167058 A1 | 6/2018 | Rasouli et al. | |

* cited by examiner

*Primary Examiner* — Daniel D Chang
(74) *Attorney, Agent, or Firm* — Renaissance IP Law Group LLP

(57) ABSTRACT

A low-power low-setup integrated clock gating (ICG) cell is disclosed. The disclosed ICG cell includes a NOR gate configured to receive an enable (E) signal and a test enable (SE) signal, and to output an EN signal. The ICG cell may include a complex gate configured to receive the EN signal and a clock (CK) signal, and to output a latched enable (ELAT) signal. The ICG cell may further include a NAND gate configured to receive the ELAT signal and the CK signal, and to output an inverted enabled clock (ECKN) signal. The ICG cell may further include an inverter configured to receive the ECKN signal from the NAND gate, and to output an enable clock (ECK) signal.

18 Claims, 5 Drawing Sheets

LOW-POWER LOW-SETUP INTEGRATED CLOCK GATING CELL WITH COMPLEX ENABLE SELECTION

RELATED APPLICATION DATA

This application claims the benefit of U.S. Provisional Application Ser. No. 62/783,171, filed on Dec. 20, 2018, the contents of which is hereby incorporated by reference in its entirety.

BACKGROUND

The present disclosure relates to integrated circuits, and more particularly, to an improved low-power low-setup integrated clock gating cell with complex enable selection.

Today's computing machines are comprised of millions of transistors, logic gates, memory units, processor cores, and the like. With the massive transition from relatively fixed-location personal computers to versatile and mobile personal computing devices, the need for more efficient computing has become acute. Battery technology has improved over the years to some degree, but still remains a challenge and pain point for users of mobile devices. Conventional integrated clock gating cells (ICGs) generally use a clock signal to control a latch, which consumes a significant amount of clock switching power. What is needed is more efficient gating cell technology.

BRIEF SUMMARY

Inventive aspects include a low-power low-setup integrated clock gating (ICG) cell. The disclosed ICG cell includes a NOR gate configured to receive an enable (E) signal and a test enable (SE) signal, and to output an EN signal. The ICG cell may include a complex gate configured to receive the EN signal and a clock (CK) signal, and to output a latched enable (ELAT) signal. The ICG cell may further include a NAND gate configured to receive the ELAT signal and the CK signal, and to output an inverted enabled clock (ECKN) signal. The ICG cell may further include an inverter configured to receive the ECKN signal from the NAND gate, and to output an enable clock (ECK) signal.

Embodiments include a low-power low-setup ICG cell that may include a NOR gate configured to receive an enable (E) signal and a test enable (SE) signal, and to output an EN signal. The ICG cell may further include a first P-type transistor P1 gated by the EN signal, and coupled to a first node. The ICG cell may further include a second P-type transistor P2 gated by the CK signal coupled in series to the first P-type transistor P1, a third P-type transistor P3 gated by an inverted enabled clock (ECKN) signal, and a first N-type transistor N1 gated by the EN signal coupled to a logic-low voltage source, and to a second node. The ICG cell may further include a second N-type transistor N2 gated by the ECKN signal coupled in series to the first N-type transistor N1, and to the first node, and a third N-type transistor N3 coupled to the second node, and gated by a logic-high voltage source.

Certain of the inventive features may be best achieved by implementing them in a graphics processing unit (GPU), or within an ARM processor core. Other types of processors or application specific integrated circuits (ASICs) can implement the inventive principles disclosed herein. The inventive concepts may be implemented within processors and/or memory modules of a variety of mobile devices such as smart phones, tablets, notebook computers, or the like, or in a variety of stationary devices such as desktop computers, routers, or the like.

BRIEF DESCRIPTION OF THE DRAWINGS

The foregoing and additional features and advantages of the present inventive principles will become more readily apparent from the following detailed description, made with reference to the accompanying figures, in which.

DETAILED DESCRIPTION

Figure 1:
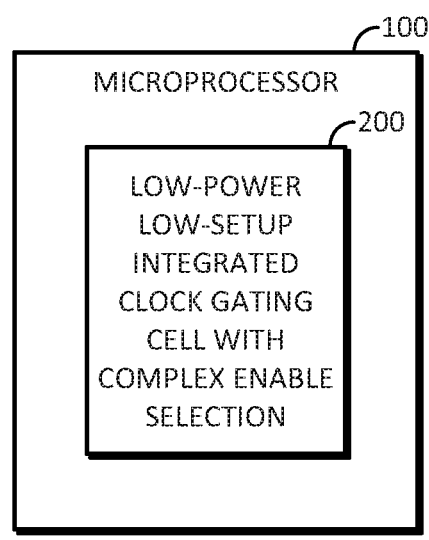
FIG. 1 illustrates an example block diagram of a microprocessor including a low-power low-setup integrated clock gating cell in accordance with embodiments disclosed herein.

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first gating cell could be termed a second gating cell, and, similarly, a second gating cell could be termed a first gating cell, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Embodiments of the present disclosure include an integrated clock gating (ICG) cell in which the latch control signals are replaced by internal control signals, which results in less frequent switching activity and saves low enabled off clock power. These internal control signals are generated by using latch states, enable inputs, and a clock signal. The latch reads the input when enable is high or previous enable state was high while clock is low. When the previous enable state was zero and the current enable signal is zero while the clock signal is low, the control signal disables internal clock switching. This saves the clock switching activity power when the clock gating cell is disabled. The control signal generating logic circuit is built and shared with a traditional NAND gate. This method reduces the clock switching power and improves the enable setup time through the complex enable selection logic.

Embodiments of the presently disclosed ICG cell include control logic that makes the latch "transparent" when previous enable state was high or the current enable input signal is high. The latch is not "transparent" only when the enable state was low and the current enable signal is also low. The new control logic is only interested in first state being low and the second state being low. In other words, the presently disclosed ICG cell focuses on saving the internal clock switching power of clock gating cell when enable is off.

Traditional standard cells use a logic gate (usually a NAND gate) to combine a clock gating enable (ELAT) state signal with a clock (CK) signal to generate an inverted output (ECKN) signal. Instead of making the latch control logic gate separate, it is built and shared with this NAND gate in accordance with disclosed embodiments herein. The control logic of the presently disclosed ICG cell produces both a latch control signal and ECKN signal. Sharing the gate saves the area and reduces the number of transistors to which the clock signal is connected.

Advantages of the presently disclosed embodiments include i) saving substantial power when the clock gating cell is disabled, and ii) improving the setup time of the enable signal, by the complex enable selection logic which latches the enable later.

FIG. 1 illustrates an example block diagram of a microprocessor 100 including a low-power low-setup integrated clock gating (ICG) cell 200 in accordance with embodiments disclosed herein. The microprocessor 100 can be any suitable microprocessor such as an ARM processor, a RISC processor, an x86 processor, or the like. In some embodiments, the microprocessor 100 is an ASIC. The ICG cell 200 is described in detail below.

Figure 2:
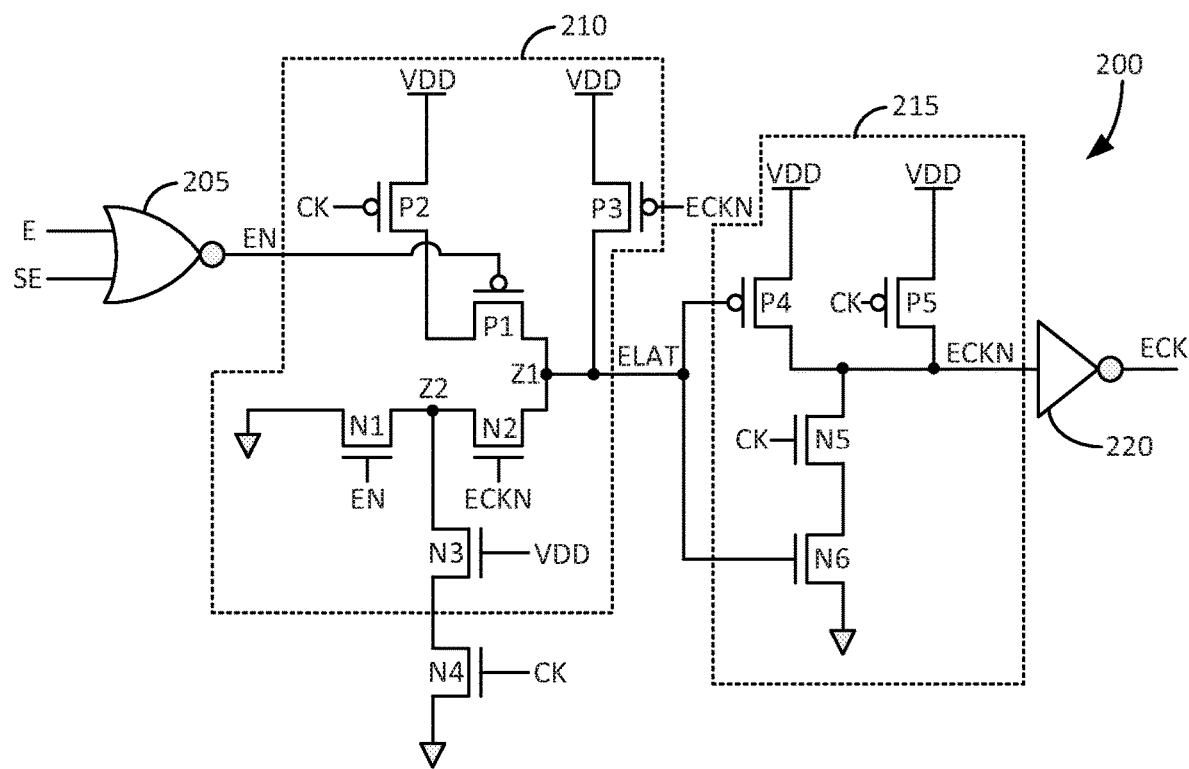
FIG. 2 illustrates another example circuit diagram of a low-power low-setup integrated clock gating cell in accordance with embodiments disclosed herein.

FIG. 2 illustrates another example circuit diagram of a low-power low-setup integrated clock gating cell in accordance with embodiments disclosed herein. The ICG cell 200 reduces clock power by passing a clock (CK) signal only when it is enabled. The ICG cell 200 may include a NOR gate 205 configured to receive an enable (E) signal and a test enable (SE) signal, and to output an EN signal. The ICG cell 200 may further include a complex gate 210 configured to receive the EN signal, the inverted enabled clock (ECKN) signal and a clock (CK) signal, and to output a latched enable (ELAT) signal. The ICG cell 200 may further include a NAND gate 215 configured to receive the ELAT signal and the CK signal, and to output an inverted enabled clock (ECKN) signal. The ICG cell 200 may further include an inverter 220 configured to receive the ECKN signal, and to output an enable clock (ECK) signal.

The complex gate 210 may include a first P-type transistor P1 gated by the EN signal received from the NOR gate 205. The transistor P1 may be coupled in series to a second P-type transistor P2, which is gated by the CK signal. The transistor P2 may be coupled to a logic-high voltage source. The transistor P1 may be coupled to a first node Z1. The complex gate 210 may further include a third P-type transistor P3 gated by the ECKN signal. The transistor P3 may be coupled to a logic-high voltage source, and to the node Z1. The complex gate 210 may further include a first N-type transistor N1 that is coupled to a logic-low voltage source, and to a second node Z2. The transistor N1 may be gated by the EN signal. The complex gate 210 may further include a second N-type transistor N2 coupled in series to the transistor N1. The transistor N2 may be coupled to the nodes Z1 and Z2, and may be gated by the ECKN signal. The complex gate 210 may further include a third always-on N-type transistor N3 gated by a logic-high voltage source VDD. The transistor N3 may be coupled to the node Z2.

The ICG cell 200 may further include a fourth N-type transistor N4. The transistor N4 may coupled in series to the transistor N3 of the complex gate 210. The transistor N4 may be gated by the CK signal. The transistor N3 may be coupled to a logic-low voltage source.

The NAND gate 215 may include a fourth P-type transistor P4 gated by the ELAT signal. The transistor P4 may be coupled to a logic-high voltage source. The NAND gate 215 may further include a fifth P-type transistor P5 gated by the CK signal. The transistor P5 may be coupled to a logic-high voltage source. The NAND gate 215 may further include a fifth N-type transistor N5 that is gated by the CK signal. The NAND gate 215 may further include a sixth N-type transistor N6 coupled in series to the transistor N5, and that is gated by the ELAT signal. The inverter 220 may be coupled to the NAND gate 215.

When the CK signal has a logic-low value, and when the EN signal transitions to the logic-low value, then the EN signal and transistor P2 pull the ELAT signal to a logic-high value. When the CK signal transitions to a logic-high value, the ECKN signal is pulled to the logic-low value by the ELAT signal and the transistor N6. Even though nothing holds the ELAT signal to a logic-high value as soon as the CK signal transitions to the logic-high value, there is no clear path for ELAT signal to discharge, and hence, the ECKN signal can be pulled to the logic-low value. Once the ECKN signal is pulled to the logic-low value, the transistor P3 holds the ELAT signal at the logic-high value. When the CK signal has the logic-low value, and when the EN signal transitions to the logic-high value, the ELAT signal is pulled to the logic-low value by the ECKN signal (which is pulled to the logic-high value due to the CK logic-low signal at the gate of the transistor N5) and by the EN NMOS stack (e.g., transistors N1 and N2). When the EN signal transitions to the logic-low value when the CK signal is at the logic-high value, the ECKN signal and the EN NMOS stack (e.g., transistors N1 and N2) can no longer hold the ELAT signal at the logic-low value. The always-on NMOS transistor N3 helps to keep the ELAT signal at the logic-low value by way of the ECKN signal and the transistor N4.

The ICG cell 200 is a domino style gate that uses a complex gate as a latched transistor, thereby sharing transistor functions. The ICG cell 200 includes a type of complex enable sampling multiplexor, which allows the critical enable (E) signal to have reduced setup time. The sampling multiplexor can be thought of us having the CK signal and the ECKN signal as inputs, and the EN signal as the select signal. The ICG cell 200 does not require a complementary clock signal. Rather, the disclosed embodiment reduces the number of clock signals that are required to control enable sampling mux. Thus, it saves the clock pin cap and clock switching power.

Figure 3:
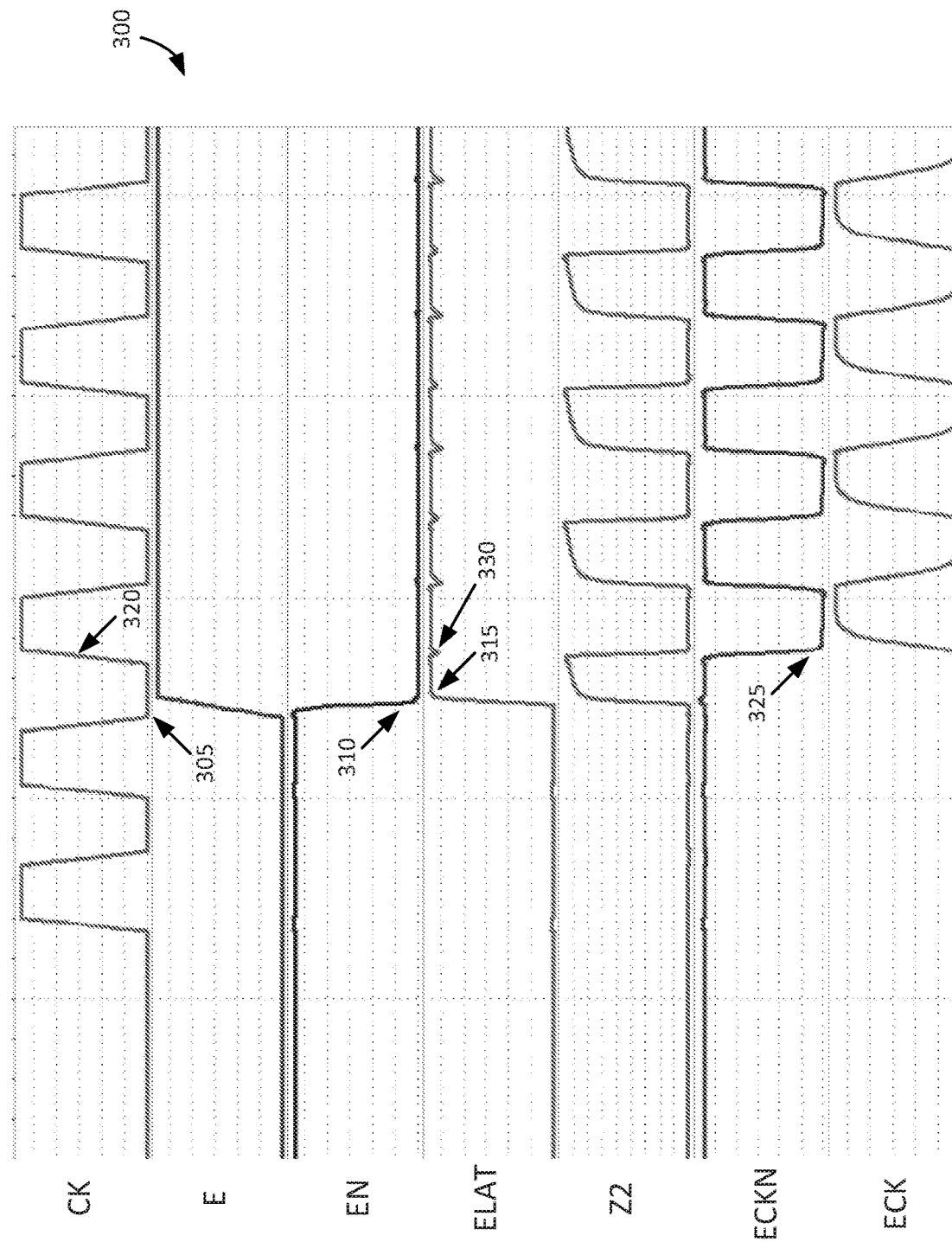
FIG. 3 illustrates an example waveform diagram of a low-power low-setup integrated clock gating cell in accordance with embodiments disclosed herein.

FIG. 3 illustrates an example waveform diagram 300 of a low-power low-setup integrated clock gating cell in accordance with embodiments disclosed herein. The waveform diagram 300 show an example where the E signal transitions to the logic-high value before the CK signal transitions to the logic-high value.

When the CK signal has a logic-low value as shown at 305, and when the EN signal transitions to the logic-low value as shown at 310, then the ELAT signal is pulled to a logic-high value as shown at 315. When the CK signal transitions to a logic-high value as shown at 320, the ECKN signal is pulled to the logic-low value as shown at 325. Even though nothing holds the ELAT signal to a logic-high value as soon as the CK signal transitions to the logic-high value at 320, there is no clear path for the ELAT signal to discharge, and hence, the ECKN signal can be pulled to the logic-low value at 325. Once the ECKN signal is pulled to the logic-low value at 325, the ELAT signal is held at the logic-high value as shown at 330.

Figure 4:
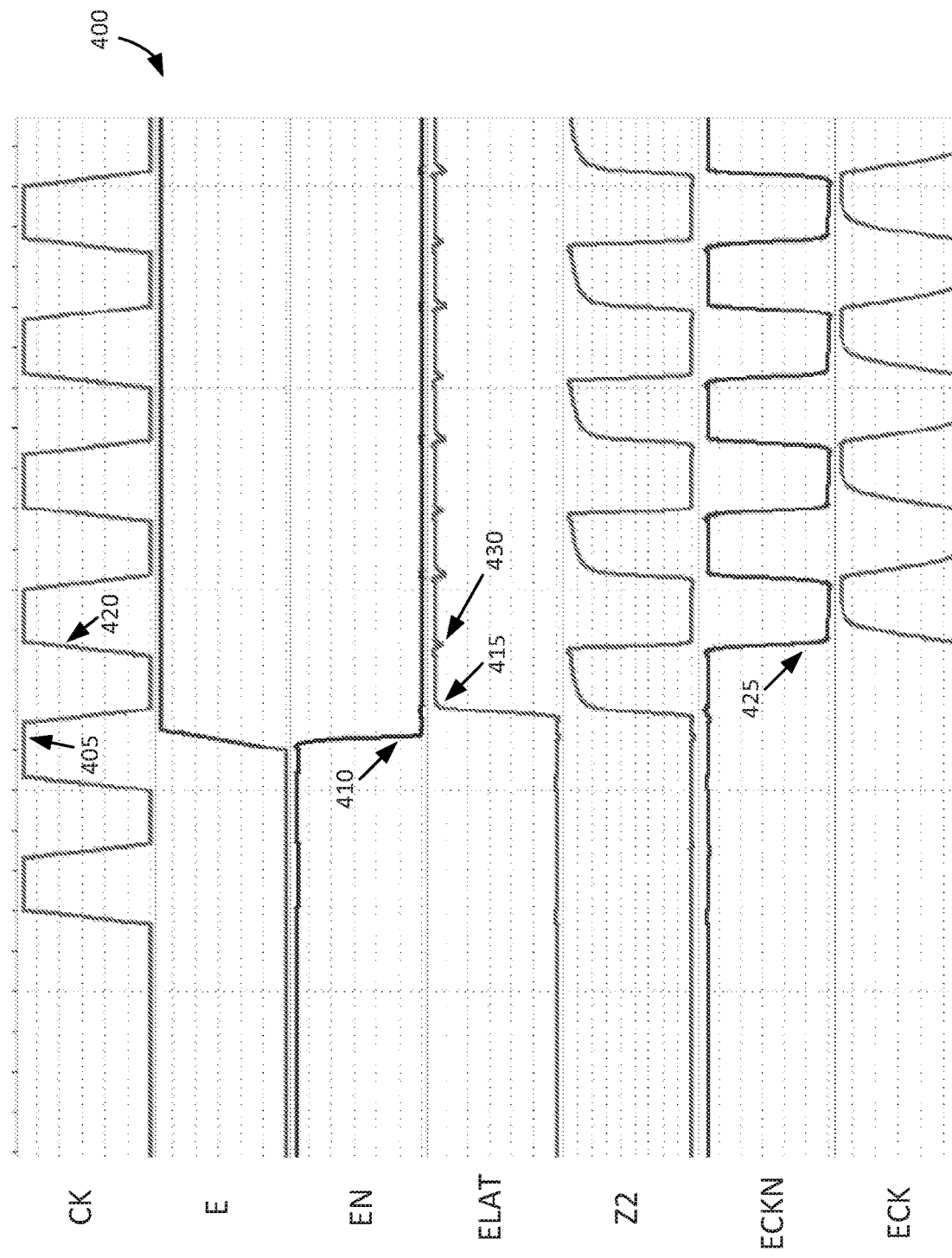
FIG. 4 illustrates another example waveform diagram of a low-power low-setup integrated clock gating cell in accordance with embodiments disclosed herein.

FIG. 4 illustrates another example waveform diagram 400 of a low-power low-setup integrated clock gating cell in accordance with embodiments disclosed herein. The waveform diagram 400 show an example where the E signal transitions to the logic-high value after the CK signal transitions to the logic-high value.

When the CK signal has a logic-high value as shown at 405, and when the EN signal transitions to the logic-low value as shown at 410, then the ELAT signal is pulled to a logic-high value as shown at 415. When the CK signal transitions to a logic-high value as shown at 420, the ECKN signal is pulled to the logic-low value as shown at 425. Even though nothing holds the ELAT signal to a logic-high value as soon as the CK signal transitions to the logic-high value at 420, there is no clear path for the ELAT signal to discharge, and hence, the ECKN signal can be pulled to the logic-low value at 425. Once the ECKN signal is pulled to the logic-low value at 425, the ELAT signal is held at the logic-high value as shown at 430.

Figure 5:
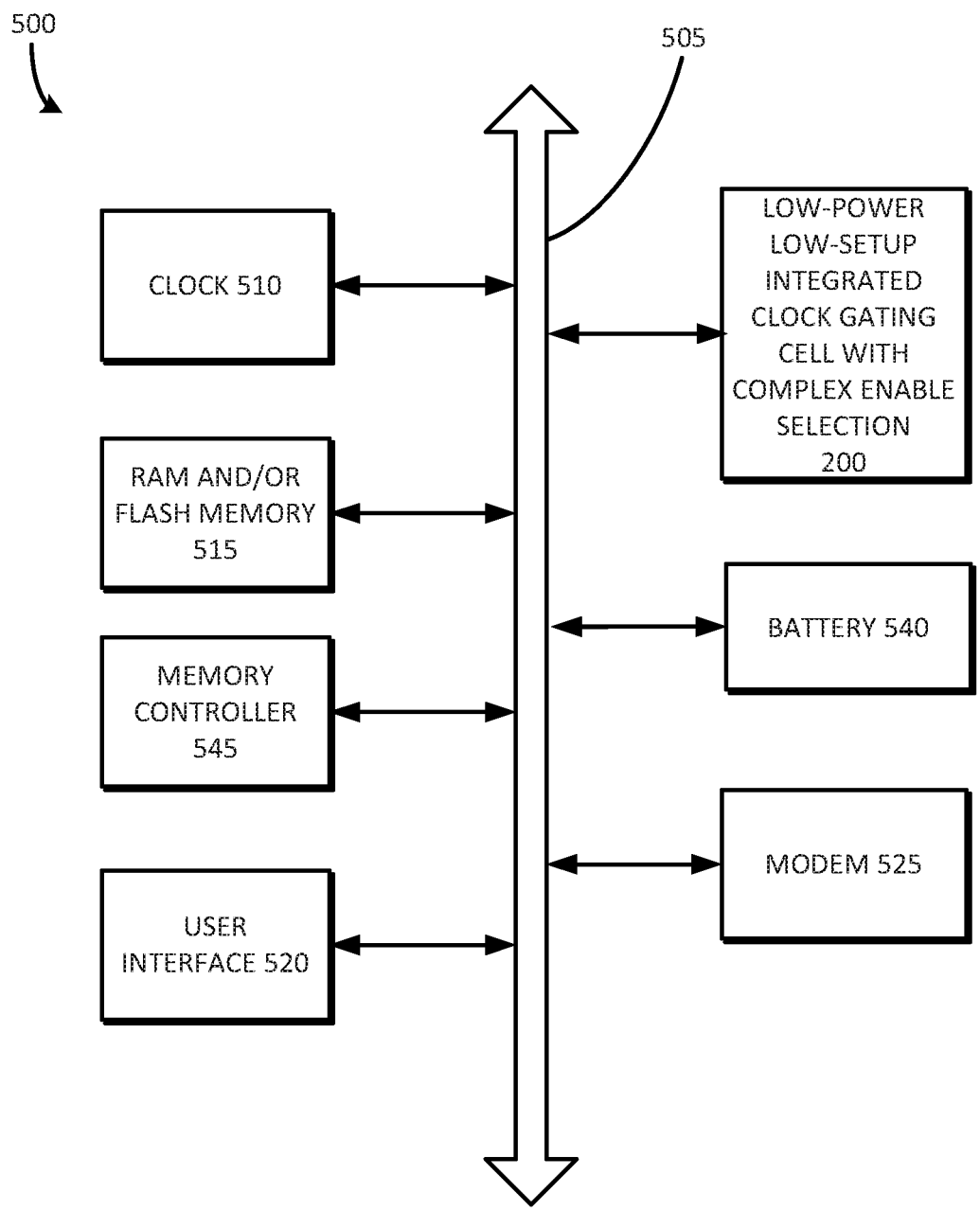
FIG. 5 is an example block diagram of a computing system including a low-power low-setup integrated clock gating cell according to embodiments disclosed herein.

FIG. 5 is an example block diagram of a computing system 500 including a low-power integrated clock gating cell 200 according to embodiments disclosed herein. The low-power integrated clock gating cell 200 may be the same as the low-power low-setup integrated clock gating cell 200 as described herein, and may be electrically connected to a system bus 505. The computing system 500 may also include a clock 510, a random access memory (RAM) and/or flash memory 515, a memory controller 545, a user interface 520, a modem 525 such as a baseband chipset, and/or automated test equipment (ATE) 535, any or all of which may be electrically coupled to the system bus 505.

If the computing system 500 is a mobile device, it may further include a battery 540, which powers the computing system 500. Although not shown in FIG. 5, the computing system 500 may further include an application chipset, a camera image processor (CIS), a mobile DRAM, and the like. The memory controller 545 and the flash memory 515 may constitute a solid state drive/disk (SSD), which uses a nonvolatile memory to store data.

In example embodiments, the computing system 500 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting a telematics network, RFID, or one of various electronic devices constituting a computing system.

The various operations of methods described above may be performed by any suitable means capable of performing the operations, such as various hardware and/or software component(s), circuits, and/or module(s).

Embodiments may include a low-power low-setup ICG cell. The disclosed ICG cell includes a NOR gate configured to receive an enable (E) signal and a test enable (SE) signal, and to output an EN signal. The ICG cell may include a complex gate configured to receive the EN signal and a clock (CK) signal, and to output a latched enable (ELAT) signal. The ICG cell may further include a NAND gate configured to receive the ELAT signal and the CK signal, and to output an inverted enabled clock (ECKN) signal. The ICG cell may further include an inverter configured to receive the ECKN signal from the NAND gate, and to output an enable clock (ECK) signal.

The complex gate may include a first P-type transistor P1 gated by the EN signal received from the NOR gate. The complex gate may further include a second P-type transistor P2 coupled in series to the first P-type transistor P1, and a third P-type transistor P3 gated by the ECKN signal. The second transistor P2 may be gated by the CK signal. The first transistor P1 may be coupled to a node Z1. The third transistor P3 may be coupled to a logic-high voltage source, and to the node Z1. The second transistor P2 may be coupled to the logic-high voltage source. The node Z1 may be referred to as a first node Z1.

The complex gate may further include a first N-type transistor N1 coupled to a logic-low voltage source, and to a second node Z2. The complex gate may further include a second N-type transistor N2 coupled in series to the first transistor N1. The complex gate may further include a third N-type transistor N3 gated by the logic-high voltage source. The first transistor N1 may be gated by the EN signal. The second transistor N2 may be coupled to the first node Z1. The third transistor N3 may be coupled to the second node Z2.

The second transistor N2 may be gated by the ECKN signal. The ICG cell may further include fourth N-type transistor N4 coupled in series to the third transistor N3. The fourth transistor N4 may be coupled to the logic-low voltage source, and may be gated by the CK signal.

The NAND gate may include a fourth P-type transistor P4 coupled to the logic-high voltage source, and gated by the ELAT signal. The NAND gate may further include a fifth P-type transistor P5 coupled to the logic-high voltage source, and gated by the CK signal. The NAND gate may further include a fourth P-type transistor P4 coupled to the logic-high voltage source, and gated by the ELAT signal. The NAND gate may further include a fifth P-type transistor P5 coupled to the logic-high voltage source, and gated by the CK signal. The NAND gate may further include a fifth N-type transistor N5 gated by the CK signal, and a sixth N-type transistor N6 coupled in series to the fifth transistor N5, and gated by the ELAT signal.

When the CK signal has the logic-low value, and when the EN signal transitions to the logic-low value, then the second transistor P2 is configured to pull the ELAT signal to the logic-high value. When the CK signal transitions to the logic-high value, then the sixth transistor N6 is configured to pull the ECKN signal to the logic-low value.

When the ECKN signal is pulled to the logic-low value, then the third transistor P3 is configured to hold the ELAT signal at the logic-high value. When the CK signal has the logic-low value, and when the EN signal transitions to the logic-high value, then the first transistor N1 and the second transistor N2 are configured to pull the ELAT signal to the logic-low value. When the EN signal transitions to the logic-low value when the CK signal is at the logic-high value, then the third transistor N3 is configured to keep the ELAT signal at the logic-low value by way of the fourth transistor N4.

The ICG cell may include a NOR gate configured to receive the E signal and the SE signal, and to output the EN signal. The ICG cell may include a first P-type transistor P1 gated by the EN signal, and coupled to a first node Z1. The ICG cell may further include a second P-type transistor P2 coupled in series to the first P-type transistor P1. The ICG cell may further include a third P-type transistor P3 gated by an inverted enabled clock (ECKN) signal. The ICG cell may further include a first N-type transistor N1 coupled to a logic-low voltage source, and to a second node Z2. The ICG cell may further include a second N-type transistor N2 coupled in series to the first transistor N1, and to the first node Z1. The ICG cell may further include a third N-type transistor N3 coupled to the second node Z2, and gated by a logic-high voltage source.

The ICG cell may further include a fourth N-type transistor N4 coupled in series to the third transistor N3. The fourth transistor N4 may be coupled to the logic-low voltage source, and is gated by a clock (CK) signal. The ICG cell may further include a fourth P-type transistor P4 coupled to the logic-high voltage source, and gated by a latched enable (ELAT) signal. The ICG cell may further include a fifth P-type transistor P5 coupled to the logic-high voltage source, and gated by the CK signal. The ICG cell may further include a fifth N-type transistor N5 gated by the CK signal, and a sixth N-type transistor N6 coupled in series to the fifth transistor N5, and gated by the ELAT signal.

The second transistor P2 may be gated by the CK signal. The third transistor P3 may be coupled to the logic-high voltage source, and to the first node. The second transistor P2 may be coupled to the logic-high voltage source. The first transistor N1 may be gated by the EN signal. The second transistor N2 may be gated by the ECKN signal.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The following discussion is intended to provide a brief, general description of a suitable machine or machines in which certain aspects of the inventive concept can be implemented. Typically, the machine or machines include a system bus to which is attached processors, memory, e.g., RAM, ROM, or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the present inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the inventive concept with reference to illustrated embodiments, it will be recognized that the illustrated embodiments can be modified in arrangement and detail without departing from such principles, and can be combined in any desired manner. And although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

Embodiments of the inventive concept may include a non-transitory machine-readable medium comprising instructions executable by one or more processors, the instructions comprising instructions to perform the elements of the inventive concepts as described herein.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

What is claimed is:

1. A low-power low-setup integrated clock gating cell, comprising:
 a NOR gate configured to receive an enable (E) signal and a test enable (SE) signal, and to output an output (EN) signal;
 a complex gate configured to receive the EN signal, a clock (CK) signal and an inverted enabled clock (ECKN) signal, and to output a latched enable (ELAT) signal;
 a NAND gate configured to receive the ELAT signal and the CK signal, and to output the ECKN signal; and
 an inverter configured to receive the ECKN signal from the NAND gate, and to output an enable clock (ECK) signal,
 wherein the complex gate comprises:
 a first P-type transistor (P1) gated by the EN signal received from the NOR gate;
 a second P-type transistor (P2) coupled in series to the first P-type transistor P1;
 a third P-type transistor (P3) gated by the ECKN signal;
 a first N-type transistor (N1) coupled to a logic-low voltage source, and to a second node;
 a second N-type transistor (N2) coupled in series to the first transistor N1; and
 a third N-type transistor (N3) gated by a logic-high voltage source,
 wherein:
 the second transistor P2 is gated by the CK signal;
 the first transistor P1 is coupled to a first node;
 the third transistor P3 is coupled to the logic-high voltage source, and to the first node;
 the first transistor N1 is gated by the EN signal;
 the second transistor N2 is coupled to the first node;
 the third transistor N3 is coupled to the second node;
 the third transistor N3 is not directly coupled to any transistor that is gated by the ELAT signal; and
 the third transistor N3 is not directly coupled to any inverter including not being directly coupled to the inverter.

2. The low-power low-setup integrated clock gating cell of claim 1, wherein the second transistor P2 is coupled to the logic-high voltage source.

3. The low-power low-setup integrated clock gating cell of claim 1, wherein the second transistor N2 is gated by the ECKN signal.

4. The low-power low-setup integrated clock gating cell of claim 1, further comprising a fourth N-type transistor (N4) coupled in series to the third transistor N3.

5. The low-power low-setup integrated clock gating cell of claim 4, wherein the fourth transistor N4 is coupled to the logic-low voltage source, and is gated by the CK signal.

6. The low-power low-setup integrated clock gating cell of claim 1, wherein the NAND gate comprises:
 a fourth P-type transistor (P4) coupled to the logic-high voltage source, and gated by the ELAT signal; and
 a fifth P-type transistor (P5) coupled to the logic-high voltage source, and gated by the CK signal.

7. The low-power low-setup integrated clock gating cell of claim 1, wherein the NAND gate comprises:
 a fourth P-type transistor (P4) coupled to the logic-high voltage source, and gated by the ELAT signal;
 a fifth P-type transistor (P5) coupled to the logic-high voltage source, and gated by the CK signal;
 a fifth N-type transistor (N5) gated by the CK signal; and
 a sixth N-type transistor (N6) coupled in series to the fifth transistor N5, and gated by the ELAT signal.

8. The low-power low-setup integrated clock gating cell of claim 7, wherein:
 when the CK signal has the logic-low value, and when the EN signal transitions to the logic-low value, then the second transistor P2 is configured to pull the ELAT signal to the logic-high value; and
 when the CK signal transitions to the logic-high value, then the sixth transistor N6 is configured to pull the ECKN signal to the logic-low value.

9. The low-power low-setup integrated clock gating cell of claim 8, wherein when the ECKN signal is pulled to the logic-low value, then the third transistor P3 is configured to hold the ELAT signal at the logic-high value.

10. The low-power low-setup integrated clock gating cell of claim 7, wherein when the CK signal has the logic-low value, and when the EN signal transitions to the logic-high value, then the first transistor N1 and the second transistor N2 are configured to pull the ELAT signal to the logic-low value.

11. The low-power low-setup integrated clock gating cell of claim 7, wherein when the EN signal transitions to the logic-low value when the CK signal is at the logic-high value, then the third transistor N3 is configured to keep the ELAT signal at the logic-low value by way of the fourth transistor N4.

12. A low-power low-setup integrated clock gating cell, comprising:
 a NOR gate configured to receive an enable (E) signal and a test enable (SE) signal, and to output an output (EN) signal;
 a first P-type transistor (P1) gated by the EN signal, and coupled to a first node;
 a second P-type transistor (P2) coupled in series to the first P-type transistor P1;
 a third P-type transistor (P3) gated by an inverted enabled clock (ECKN) signal;
 a first N-type transistor (N1) coupled to a logic-low voltage source, and to a second node;
 a second N-type transistor (N2) coupled in series to the first transistor N1, and to the first node; and
 a third N-type transistor N3 coupled to the second node, and gated by the logic-high voltage source,
 wherein:
 the second transistor P2 is gated by the CK signal;
 the first transistor P1 is coupled to a first node;
 the third transistor P3 is coupled to the logic-high voltage source, and to the first node;
 the first transistor N1 is gated by the EN signal;
 the second transistor N2 is coupled to the first node;
 the third transistor N3 is coupled to the second node;
 the third transistor N3 is not directly coupled to any transistor that is gated by the first node; and
 the third transistor N3 is not directly coupled to any inverter including not being directly coupled to the inverter.

13. The low-power low-setup integrated clock gating cell of claim 12, further comprising a fourth N-type transistor (N4) coupled in series to the third transistor N3.

14. The low-power low-setup integrated clock gating cell of claim 13, wherein the fourth transistor N4 is coupled to the logic-low voltage source, and is gated by a clock (CK) signal.

15. The low-power low-setup integrated clock gating cell of claim 14, further comprising:
   a fourth P-type transistor (P4) coupled to a logic-high voltage source, and gated by a latched enable (ELAT) signal;
   a fifth P-type transistor (P5) coupled to the logic-high voltage source, and gated by the CK signal;
   a fifth N-type transistor (N5) gated by the CK signal; and
   a sixth N-type transistor (N6) coupled in series to the fifth transistor N5, and gated by the ELAT signal.

16. The low-power low-setup integrated clock gating cell of claim 15, wherein:
   when the CK signal has the logic-low value, and when the EN signal transitions to the logic-low value, then the second transistor P2 is configured to pull the ELAT signal to the logic-high value;
   when the CK signal transitions to the logic-high-value, then the sixth transistor N6 is configured to pull the ECKN signal to the logic-low value; and
   when the ECKN signal is pulled to the logic-low value, then the third transistor P3 is configured to hold the ELAT signal at the logic-high value.

17. The low-power low-setup integrated clock gating cell of claim 16, wherein:
   when the CK signal has the logic-low value, and when the EN signal transitions to the logic-high value, the first transistor N1 and the second transistor N2 are configured to pull the ELAT signal to the logic-low value; and
   when the EN signal transitions to the logic-low value when the CK signal is at the logic-high value, then the third transistor N3 is configured to keep the ELAT signal at the logic-low value by way of the fourth transistor N4.

18. The low-power low-setup integrated clock gating cell of claim 14, wherein:
   the second transistor P2 is gated by the CK signal;
   the third transistor P3 is coupled to the logic-high voltage source, and to the first node;
   the second transistor P2 is coupled to the logic-high voltage source;
   the first transistor N1 is gated by the EN signal; and
   the second transistor N2 is gated by the ECKN signal.

* * * * *